Nov. 1, 1966 H. S. BEST ETAL 3,281,923

METHOD OF ATTACHING LEADS TO THIN FILMS

Filed Aug. 27, 1964

INVENTORS
Howard S. Best
Norman M. Edelson

BY Wally S. Zebrowski

ATTORNEY

United States Patent Office 3,281,923
Patented Nov. 1, 1966

3,281,923
METHOD OF ATTACHING LEADS TO THIN FILMS

Howard S. Best and Norman M. Edelson, Raleigh, N.C., assignors to Corning Glass Works, Corning, N.Y., a corporation of New York Filed Aug. 27, 1964, Ser. No. 392,393
7 Claims. (Cl. 29—155.5)

This invention relates to thin electroconductive films and more particularly to a method of attaching leads to thin film electrical circuits, but is in no way limited thereto.

Thin film electrical circuits, such as microcircuits, are complete minute electrical circuits comprising a dielectric substrate to which is applied an electroconductive film of metal, metallic oxide, or the like. For one example of a suitable electroconductive metallic oxide film, its characteristics and method of application, reference is made to U.S. Patent No. 2,564,706 issued to John M. Mochel. The electroconductive films having one or more compositions, are suitably patterned and form electrical connections between selected points on the substrate. For example, metallic films may comprise the circuit conductors while metallic oxide films may form resistances within the circuit. In addition, other electrical components such as capacitors, transistors, or the like may also form a part of a microcircuit, in a manner well known to one familiar with the art. Wire terminals or leads are thereafter electrically connected to such a microcircuit, by means of which leads the entire circuit can be plugged into or out of a complete electronic system in much the same manner as an ordinary electronic vacuum tube.

Heretofore, such leads were attached to an electroconductive film by soldering, mechanical crimping to the film and substrate with or without additional soldering, direct resistance welding, or the like. There are many problems with such methods. For example, a soldered connection has low mechanical strength and 100 percent inspection is necessary to obtain components having acceptable functional reliability. Although mechanical crimping provides adequate mechanical strength, it results in a high resistance connection whether soldered or unsoldered. Direct resistance welding of a lead to a film is useful only when thick films are employed since thin films generally burn up during welding. Thin films are herein defined as those having a thickness of less than 0.002 inch. In addition, a connection formed by direct resistance welding is mechanically weak in that its strength depends solely on the strength of the film itself.

The objects of the present invention are to provide an economic method of attaching a lead to a thin electroconductive film whereby a mechanically strong, electrically low resistance, highly reliable connection can be obtained, while the above described difficulties are avoided.

Broadly, according to the present invention the method for attaching a lead to a thin electroconductive film comprises providing an apertured substrate to which said film has been applied where said aperture also extends through said film, providing a lead having an outwardly extending flange intermediate the ends thereof, inserting one end of the flanged lead through said aperture so that a portion of said one end extends beyond the other side of said substrate when the flange is disposed adjacent the aperture bordering region of said substrate, applying a force to said lead along its longitudinal axis to upset or deform the extending portion of said lead whereby said substrate-film combination is clamped between the flange and the upset portion, and dissipating electrical energy within said lead thereby heating it sufficiently to fusably unite the lead and the film at the aperture bordering region thereof.

Additional objects, features, and advantages of the present invention will become apparent to those skilled in the art, from the following detailed description and the attached drawing on which, by way of example, only the preferred embodiments of this invention are illustrated.

Figure 1:
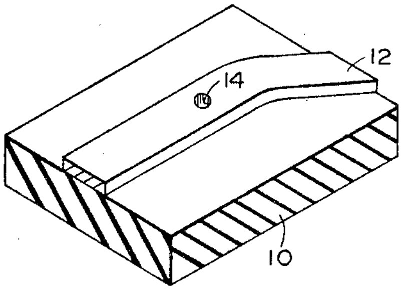
FIGURE 1 is a fragmentary oblique view of a thin film applied to an apertured substrate.

Referring now to FIGURE 1, there is shown a flat substrate 10 with a thin electroconductive film 12, illustrated in an exaggerated thickness, applied to one flat surface of said substrate. An aperture 14 extends through substrate 10 and film 12. The electroconductive film and substrate materials will vary with the particular application and are not critical so long as the film is electrically conductive while the substrate is substantially non-conductive. Examples of suitable film materials are metals, metal oxides, and the like. Glass, ceramics, glass-ceramics, alumina, or the like are examples of suitable substrate materials.

Figure 2:
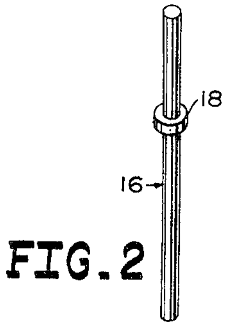
FIGURE 2 is an oblique view of a flanged lead.

FIGURE 2 shows a lead 16 with a flange 18 intermediate the ends thereof. The lead material is not critical as long as it is electrically conductive. Suitable lead materials are Dumet which is a copper clad nickel-iron combination, nickel, copper, Kovar, Sylvania #4 alloy, or the like.

Figure 3:
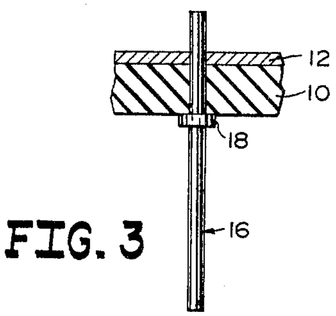
FIGURE 3 is a cross sectional elevation of an assembly of the members shown in FIGURES 1 and 2.

The assembly of lead 16 with substrate 10 and film 12 is shown in FIGURE 3. A portion of that end of lead 16 which was inserted into aperture 14 extends beyond the substrate-film combination when flange 18 is disposed adjacent the aperture bordering region of substrate 10.

Figure 4:
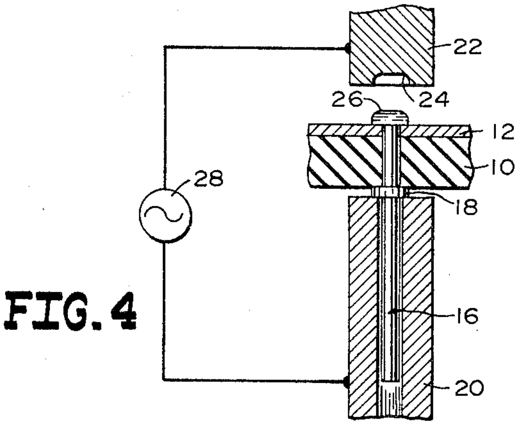
FIGURE 4 is a cross sectional elevation illustrating the deformation of the flanged lead.

Referring to FIGURE 4, the method of this invention is illustrated by exerting a force on lead 16 along its longitudinal axis by means of dies 20 and 22. Die 20 is adapted to surround the lower portion of lead 16 and come to rest against one side of flange 18. Die 22 has a cavity 24 formed in the lead contacting end thereof. As die 20 is positioned in contact with flange 18, die 22 is caused to exert a force on lead 16 upsetting or deforming, in rivet-like fashion, at least that portion of said lead that extends beyond the substrate-film combination thereby spreading it out over the aperture bordering region of film 12 to form cap 26. Dies 20 and 22 are connected to a suitable source 28 of electrical energy. While dies 20 and 22 are in contact with lead 16, electrical current passes through said lead causing it to become heated. Heat is conducted by said lead to the aperture bordering region of film 12 whereby lead 16 is fused to film 12 at said region. It should be noted that lead 16 may be heated immediately before, simultaneously with, or even after upsetting thereof, however, it is preferred to heat said lead immediately before and/or while it is being upset to reduce the amount of force necessary for upsetting.

The amount of current and the time through which it is applied will vary with the lead, film, and die materials, however, one familiar with the art can readily select the proper time and electrical parameters. Of course, current need not pass through the lead continuously while the dies are in contact with it, since, suitable means for regulating the current may be incorporated into the electrical circuit by one familiar with the art, when desired.

Figure 5:
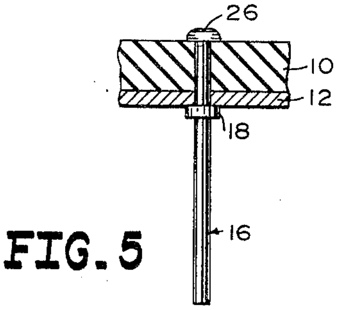
FIGURE 5 is a cross sectional elevation of another embodiment of this invention.

FIGURE 5 illustrates another embodiment of this invention. Lead 16 is upset as heretofore described but is fused to the aperture bordering region of film 12 at shoulder 18 rather than cap 26.

A typical example of carrying out this invention is illustrated by the following. A suitably patterned film of copper having a thickness of about 0.0001 to about 0.0002 inch was applied to a flat glazed alumina substrate having a thickness of about 0.030 inch and an aperture therein of about 0.019 inch in diameter. A 0.016 inch diameter lead of copper clad iron-nickel material having a flange of 0.040 inch in diameter intermediate the ends thereof was inserted into said aperture from the film side until said flange contacted the aperture bordering region of the film surface. The end of the lead protruded beyond the substrate surface. A force of one pound was applied to the lead along its longitudinal axis by a pair of dies thereby upsetting the protruding end of said lead in rivet-like fashion until the substrate-film combination was clamped between the flange and the upset portion of the lead. A.C. electrical energy having a potential of 4 volts was simultaneously passed through the lead by means of said dies thereby heating and fusably uniting the lead flange to the film at the apertured bordering region thereof.

It was found that the lead was firmly secured to the film and the electrical connection was of low resistance. Further, it was found that the connection formed a hermetic seal between one side of the substrate and the other.

It has been found that the lead flange acts as a heat sink, therefore the location of heat concentration can be controlled by the size of the flange. It has also been found that to concentrate the heat at the upset end of the lead when it is desired to fuse that end to the film, the flange must be made suitably small and the upsetting die must be formed of material having low heat conductivity, such as tungsten for example.

It should be noted that, although the invention was described with the flange having been preformed on the lead or attached thereto, the flange may be formed on the lead as part of the upsetting process if desired.

Although the present invention has been described with respect to specific details of certain embodiments thereof, it is not intended that such details be limitations upon the scope of the invention except insofar as set forth in the following claims.

We claim:

1. A method of attaching a lead to a thin electroconductive film applied to a flat apertured substrate wherein said aperture also extends through said film comprising the steps of (a) providing a lead having an outwardly extending flange intermediate the ends thereof, (b) inserting one end of the flanged lead through said aperture so that a portion of said one end extends beyond said substrate while said flange is disposed adjacent the aperture bordering region of said substrate, (c) applying a force to said lead along the longitudinal axis thereof to upset said portion of said lead and clamp the substrate-film combination between said flange and the upset portion, and (d) heating the lead to a temperature sufficient to fusably unit said lead to said film at the aperture bordering region thereof by dissipating electrical energy within said lead.

2. The method of claim 1 wherein said lead is inserted from the film side of said combination for arrangement of said flange in contact with the aperture bordering region of said film.

3. The method of claim 1 wherein said lead is inserted from the substrate side of said combination for arrangement of said flange in contact with the aperture bordering region of said substrate.

4. The method of claim 1 wherein the steps of applying a force and heating the lead are performed simultaneously.

5. A method of attaching a lead to a thin electroconductive film comprising the steps of (a) providing an apertured substrate, (b) applying a thin electroconductive film to said substrate wherein said aperture also extends through said film, (c) providing a lead having an outwardly extending flange intermediate the ends thereof, (d) inserting one end of the flanged lead through said aperture so that a portion of said one end extends beyond said substrate while said flange is disposed adjacent the aperture bordering region of said substrate, (e) applying a force to said lead along the longitudinal axis thereof to upset said portion of said lead and clamp the substrate-film combination between said flange and the upset portion, and (f) heating said lead to a temperature sufficient to fusably unite said lead to said film at the aperture bordering region thereof by dissipating electrical energy within said lead.

6. A method of attaching a lead to a thin electroconductive film comprising the steps of (a) providing an apertured dielectric substrate of a material selected from the group consisting of glass, ceramics, glass-ceramics and alumina, (b) applying an electroconductive film having a thickness of less than 0.002 inch of material selected from the group consisting of metals and metal oxides to said substrate wherein the aperture also extends through said film, (c) providing a lead of material selected from the group consisting of copper clad nickel-iron, nickel, and copper having an outwardly extending flange intermediate the ends thereof, (d) inserting one end of the flanged lead through said aperture so that a portion of said one end extends beyond the substrate-film combination while said flange is disposed adjacent the aperture bordering region of said substrate, (e) applying a force to said lead along the longitudinal axis thereof to upset said portion of said lead and clamp said substrate-film combination between said flange and the upset portion, and (f) heating the lead to a temperature sufficient to fusably unite said lead and said film at the aperture bordering region thereof by dissipating electrical energy within said lead.

7. The method of claim 6 wherein the steps of applying a force and heating the lead are performed simultaneously.

References Cited by the Examiner

UNITED STATES PATENTS

| | | | |
|---|---|---|---|
| 2,599,710 | 6/1952 | Hathaway | 29—155.5 |
| 3,098,287 | 7/1963 | Buchsbaum | 29—155.5 |
| 3,098,951 | 7/1963 | Ayer | 317—101 |
| 3,213,325 | 10/1965 | Lindstrand | 317—101 |
| 3,221,386 | 12/1965 | Demarest | 29—25.11 |

FOREIGN PATENTS

| | | |
|---|---|---|
| 243,429 | 12/1960 | Australia. |
| 737,998 | 10/1955 | Great Britain. |

References Cited by the Applicant

UNITED STATES PATENTS

| | | |
|---|---|---|
| 2,586,854 | 2/1952 | Myers. |
| 2,610,248 | 9/1952 | Reid. |
| 2,694,249 | 11/1954 | Kapp. |
| 2,909,833 | 10/1959 | Murray et al. |
| 3,076,165 | 1/1963 | Weyrich. |

JOHN F. CAMPBELL, *Primary Examiner.*

W. I. BROOKS, *Examiner.*